United States Patent [19]

Chao

[11] Patent Number: 4,496,857
[45] Date of Patent: Jan. 29, 1985

[54] HIGH SPEED LOW POWER MOS BUFFER CIRCUIT FOR CONVERTING TTL LOGIC SIGNAL LEVELS TO MOS LOGIC SIGNAL LEVELS

[75] Inventor: Hu H. Chao, Yorktown Heights, N.Y.

[73] Assignee: International Business Machines Corp., Armonk, N.Y.

[21] Appl. No.: 437,991

[22] Filed: Nov. 1, 1982

[51] Int. Cl.³ ............... H03K 19/096; H03K 17/284; H03K 17/693
[52] U.S. Cl. .................... 307/475; 307/452; 307/453; 307/579; 307/279
[58] Field of Search ............. 307/443, 475, 451–453, 307/576, 579, 583, 585, 264, 279, 291

[56] References Cited

U.S. PATENT DOCUMENTS

| | | | |
|---|---|---|---|
| 3,631,528 | 12/1971 | Green | 307/304 X |
| 3,983,543 | 9/1976 | Codaro | 307/279 X |
| 4,131,808 | 12/1978 | Kuo | 307/270 |
| 4,150,308 | 4/1979 | Adlhoch | 307/279 X |
| 4,214,175 | 7/1980 | Chan | 307/279 X |
| 4,247,921 | 1/1981 | Itoh et al. | 307/475 X |
| 4,258,272 | 3/1981 | Huang | 307/475 |
| 4,281,260 | 7/1981 | Moegen et al. | 307/279 X |
| 4,291,242 | 9/1981 | Schriber | 307/475 X |
| 4,301,381 | 11/1981 | Clemen et al. | 307/475 |
| 4,307,308 | 12/1981 | Sano | 307/475 |
| 4,309,630 | 1/1982 | Young, Jr. | 307/443 X |
| 4,318,015 | 3/1982 | Schade, Jr. | 307/475 |
| 4,396,845 | 8/1983 | Nakano | 307/475 |
| 4,417,163 | 11/1983 | Otsuki et al. | 307/475 |

OTHER PUBLICATIONS

Lewis et al., "Bipolar Level to FET Logic Level Buffer Circuit", IBM TDB, vol. 19, No. 8, Jan., 1977, pp. 2953–2954.

Furman, "Address Buffer True/Complement Generator", IBM TDB, vol. 18, No. 11, Apr., 1976, pp. 3957–3958.

Gladstein et al., "Low-Power Ratioless True-Complement Buffer", IBM TDB, vol. 18, No. 8, Jan., 1976, pp. 2591–2592.

Freeman et al., "Level Shifting Circuit", IBM TDB, vol. 18, No. 5, Oct., 1975, p. 1450.

Parikh, "True and Complement High Level Signal Circuit", IBM TDB, vol. 20, No. 3, Aug., 1977, pp. 954–956.

Primary Examiner—Stanley D. Miller
Assistant Examiner—David R. Hudspeth
Attorney, Agent, or Firm—Pollock, Vande Sande & Priddy

[57] ABSTRACT

MOS semiconductor address buffer for converting TTL logic states to a MOS logic state requiring only a single clock and having improved power efficiency. The address buffer operates in response to the single clock pulse to set a latch and connect the latch to output drives for providing complementary MOS logic levels.

3 Claims, 2 Drawing Figures

HIGH SPEED LOW POWER MOS BUFFER CIRCUIT FOR CONVERTING TTL LOGIC SIGNAL LEVELS TO MOS LOGIC SIGNAL LEVELS

BACKGROUND OF INVENTION

The present invention pertains to the MOS semiconductor art. Specifically, a buffer circuit for converting TTL logic signal levels to MOS logic signal levels is described.

In the MOS semiconductor art large scale integrated circuits are produced. Included among this class of semiconductor devices are MOS memories which are addressed through a plurality of address signals and the logical complement of these signals.

In many applications of memories and other types of circuit devices produced in the technology it is necessary to drive the circuit device from another type of semiconductor logic circuitry such as TTL. The TTL circuitry operates at different voltage levels providing a binary 1 at greater than 2.2 volts and a binary 0 at less than 0.6 volts. These logic levels are insufficient and in some instances incompatible with MOS logic levels.

Buffer circuits have been devised to provide conversion of TTL logic levels to levels compatible with MOS logic circuits. These are included in a 16K dynamic RAM, No. MK 4116, manufactured by MOSTEK which can be driven directly with TTL logic. The device is power efficient but requires three clocks to operate. The multiple clocks impose an undesirable speed limitation on the operation of the buffer and hence to the remaining circuitry connected with the buffer.

In an other type of RAM which interfaces with TTL logic circuits, manufactured by Hitachi as MH6147, a high speed static 16K RAM, the speed of the device is adequate. The power efficiency, however, suffers because of the d.c. current flow through an inverter in the device which receives the TTL driving signals.

SUMMARY OF THE INVENTION

It is an object of the invention to provide an interface circuit between any type of MOS logic circuit and an TTL logic circuit.

It is more particular object of the invention to provide an address buffer for a MOS memory which is high speed and power efficient.

These and other objects are accomplished by circuitry in accordance with the present invention. A cross coupled latch is provided which is controlled by chip enable signals CSI, and its complement $\overline{CSI}$. During one state of the CSI and $\overline{CSI}$ signals, the latch is disabled conserving power, and the cross coupled latch receives as an input a reference level and a TTL logic level. The latch will assume a state corresponding to the received TTL level during a second state of the signals. A pass circuit connects the latch nodes to first and second inverter chains. During the second state of the CSI and $\overline{CSI}$ signals the latch assumes the appropriate logic state defined by the reference level and TTL level and the pass circuit makes the connection between inverter chains and the nodes providing a MOS logical level and its complement. During the one state of the CSI and $\overline{CSI}$ signals the cross-coupled latch is isolated from the inverter chains by an interrupt function of the pass circuit.

DESCRIPTION OF THE PREFERRED EMBODIMENT

Figure 1:
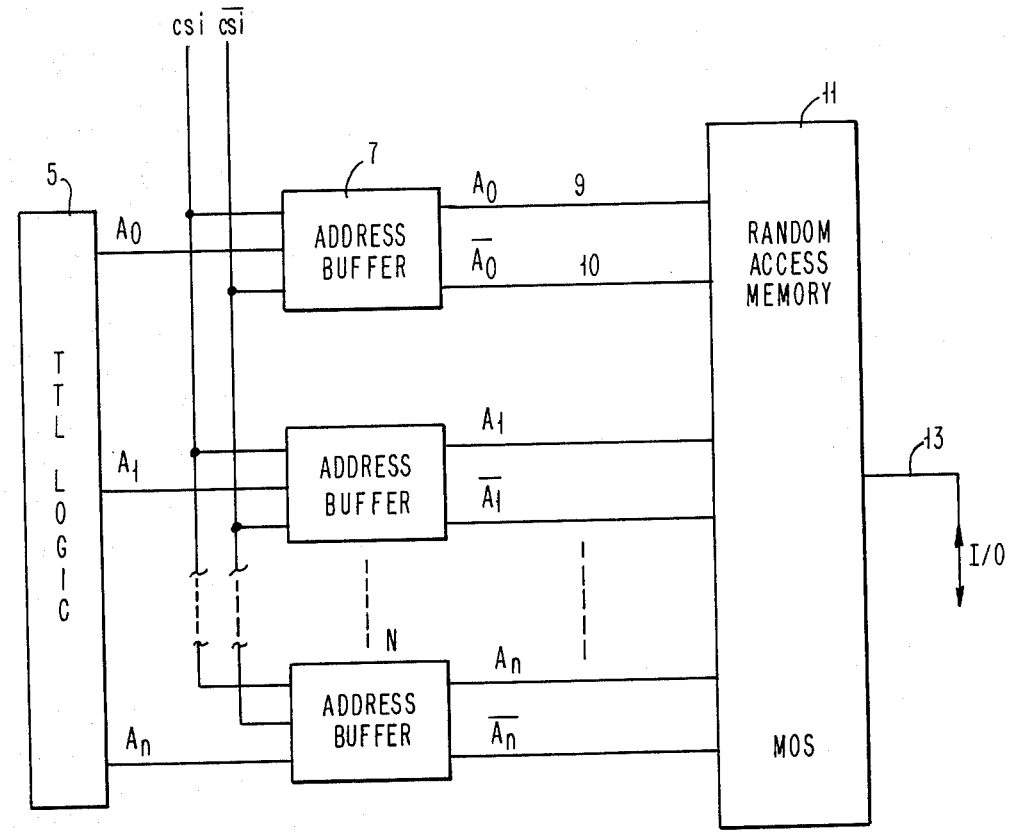
FIG. 1 is a block diagram of a buffer according to one embodiment of the invention which provides MOS logic levels from TTL logic levels.

Referring now to FIG. 1, there is shown an MOS RAM 11 having a plurality of address inputs Ao through An. Although the preferred embodiment is described in terms of an address buffer for a memory, its use for converting TTL logic levels to MOS logic levels is applicable to other circuit devices. The address lines also include complementary inputs Ao to An. The MOS RAM 11 is addressed by a TTL logic circuit 5. The input TTL logic levels are less than 0.6 volts and greater than 2.2 volts corresponding to a binary 0 and 1 respectively. The output logic levels are between 0 and 5 volts respectively for driving the address inputs of MOS RAM 11. The buffer 7 requires a single clock represented by CSI and its complement, $\overline{CSI}$.

Figure 2:
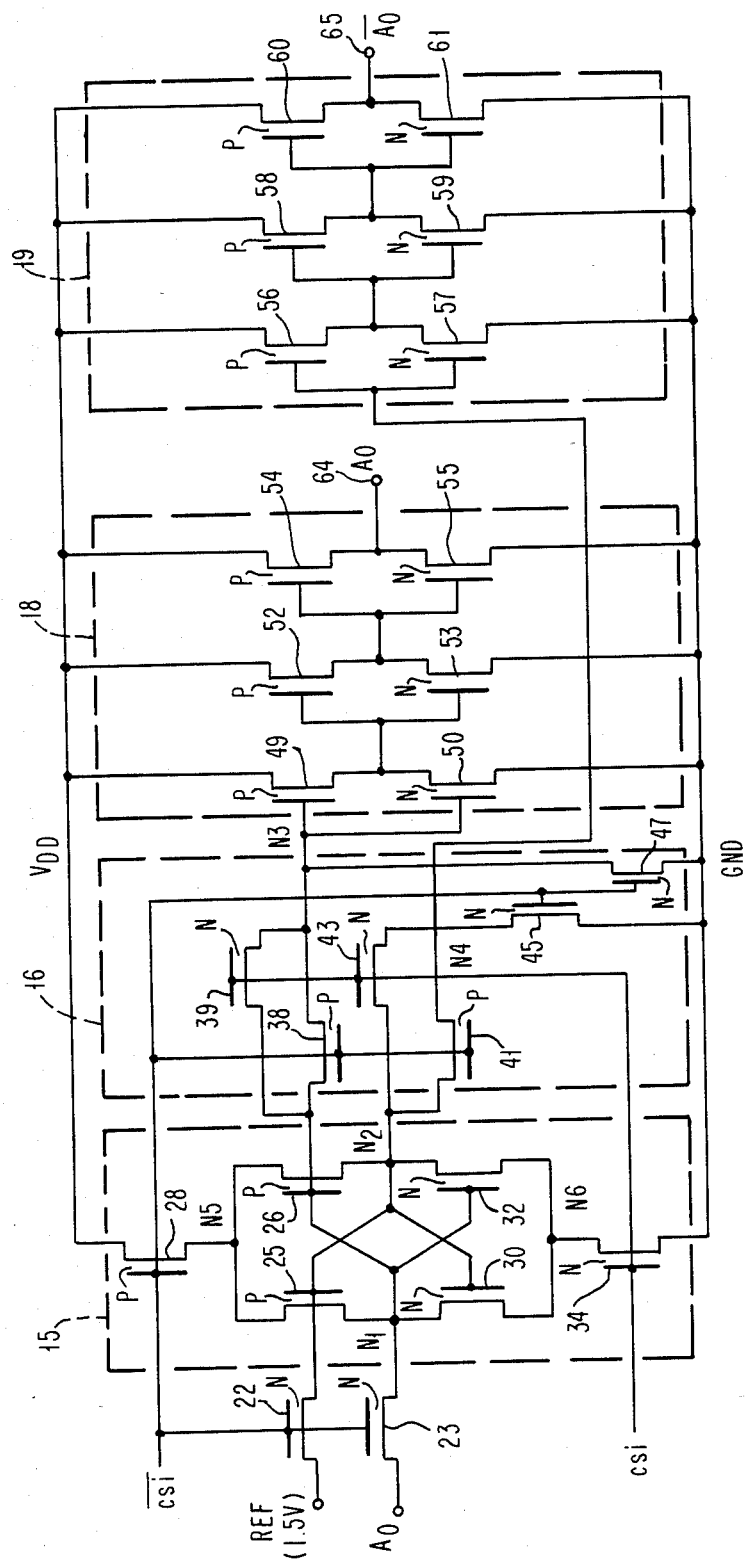
FIG. 2 is a schematic illustration of a buffer according to a preferred embodiment of the invention.

Referring now to FIG. 2, one embodiment of the buffer is shown implemented in MOS semiconductor techniques. The elements of the buffer are field effect transistors of either N or P channel type hereinafter referred to as an NFET or PFET. The input cross coupled latch is provided by circuitry 15. The cross coupled latch 15 includes first and second switches comprising NFET 34 and PFET 28. The switches feed a pair of parallel connected, serial transistor pairs 25, 30 and 26, 32. FET 25 and 26 are P channel and 30 and 32 are N channel. The gates of each transistor pair 25, 30 and 26, 32 are connected together with the junction of an opposite transistor pair to form first and second Nodes $N_1$, $N_2$.

The cross coupled latch 15 receives on each node $N_1$, $N_2$ a reference voltage and TTL logic level through NFET 22 and NFET 23. The cross coupled latch 15 receives the node input voltages during $\overline{CSI}=1$. The chip select, CSI, occurs when the MOSRAM 11 address lines are to be addressed. The CSI pulse along with its complement $\overline{CSI}$ is the only clock pulse required to operate the buffer.

The nodes of the cross coupled latch 15 are connected to a current path circuit 16. The current path circuit 16 also operates under control of CSI and $\overline{CSI}$. During $\overline{CSI}=1$, the nodes are connected via current path circuit 16 to the inputs $N_3$, $N_4$ of inverter chains 18 and 19. During the period when $\overline{CSI}=1$ and $\overline{CSI}=0$ the connection between the inverter chains 18 and 19 and the nodes $N_1$, $N_2$ are interrupted thus isolating the inverter chains from the cross coupled latch 15. The current path operates in a PASS mode in response to the CSI pulse = 1 and $\overline{CSI}$ pulse = 0 by gating NFET 39 and 43 and PFET 38 and 41 into conduction and maintaining NFET 45 and 47 OFF. During $\overline{CSI}=1$ NFET 39, 43 and PFET 38, 41 are gated off thus isolating the inverter chains 18 and 19 from Nodes $N_1$, $N_2$ of the cross coupled latch 15, and NFET 45 and 47 are gated on returning the inverter chains 18, 19 inputs, $N_3$, $N_4$ to ground.

The inverter chains are identical except for their input connections. The chains comprise three PFETS 49, 52, 54 and 56, 58, 60 having a drain connection to VDD, and serially connected to three NFETS, 50, 53, 55, and 57, 59, 61 which provide through respective source connections a return connection to ground. The gates of a pair of serially connected transistors are connected together to form an input connection, and the common connections of the NFET and PFET from an output connection.

The entire circuit functions to minimize power consumption and maximize speed using only a single clock pulse CSI and its complement. The nodes $N_1$, $N_2$ are established at the TTL level Ao and REF voltage, 1.5 volts, during $\overline{CSI}=1$. At the beginning of $\overline{CSI}=1$, the switches in the latch 15 comprising NFET 34 and PFET 28 are activated and latch 15 assumes the state determined by TTL logic level $\overline{Ao}$. Inverter chains 18 and 19 are connected to the nodes $N_1$ and $N_2$ and provide complementary MOS output levels Ao and $\overline{Ao}$. At the end of $\overline{CSI}=1$, the cross coupled latch 15 is decoupled from the inverter chains 18, and 19. Inputs to the inverter chains 18 and 19 are maintained at GND by NFETS 45, 47 and the outputs are maintained at VDD. Maintaining the cross coupled latch 15 off prior to $\overline{CSI}=1$, reduces over all power consumption.

The buffer of FIG. 2 can be implemented in CMOS. The following description of each of the FETS of FIG. 2 can be implemented to yield one embodiment of the invention.

| Transistor No. | Type | Width/Length |
| --- | --- | --- |
| 22, 23 | N | 4 |
| 25, 26, 28 | P | 16 |
| 30, 32 | N | 6.4 |
| 34 | N | 8.0 |
| 38, 41 | P | 5.0 |
| 39, 43 | N | 2.0 |
| 45, 47 | N | 4.0 |
| 49, 56 | P | 10.0 |
| 50, 57 | N | 8.0 |
| 52, 58 | P | 30.0 |
| 53, 59 | N | 12.0 |
| 54, 60 | P | 125.0 |
| 55, 61 | N | 100.0 |

Thus, the invention has been described in terms of one embodiment. Those skilled in the art will recognize other embodiments defined more particularly by the claims which follow.

Technical Improvement

A lower power high speed address buffer is provided for converting TTL level signals to MOS level signals and their complement.

What is claimed is:

1. A buffer circuit for providing a MOS logic level from a TTL logic level comprising:
    a cross coupled latch formed from a first pair and a second pair of transistors, said pairs connected together in parallel, each of said transistor pairs including an N channel FET and P channel FET serially connected, the gate connections of each transistor pair forming first and second nodes with the common channel connection of the remaining transistor pair, said first and second switches serially connected to each end of said parallel pairs for supplying current to first and second ends of said transistor pairs in response to a clock signal, CSI, and an inverse clock signal, $\overline{CSI}$,;
    means for connecting a power supply across ends of said first and second switches;
    first and second transistor gates connected to provide first and second signal paths to said nodes, one of said transistor gates connected to receive a TTL logic input level, and the second to receive a reference voltage level, said transistor gates operating in response to said $\overline{CSI}$ signal;
    first and second FET inverter chains, each having an input and output, said inverter chains connected to a supply of voltage for establishing a MOS logic level; and
    first and second current path means connecting one of said inverter chain inputs to one of said nodes and the remaining of said inverter chain inputs to the remamining of said nodes, said current path means operative in response to said CSI signal and $\overline{CSI}$ signal to open and close said current path means; whereby said signals at a first logic state connect said nodes to said reference level and TTL logic level, and open said current path means, and at a second logic state operates said cross coupled latch and connect said nodes to said inverter chain inputs whereby complementary MOS logic levels are produced.

2. A buffer circuit for providing a MOS logic state from a TTL logic signal comprising:
    a MOS FET latch comprising first and second parallel connected, pairs of series connected transistors, each pair comprising an N channel FET and P channel FET having a common gate connection, said common gate connection connected to the series channel connection point of an opposite transistor pair; first and second switches connected to supply and deliver current to one end and from a remaining end, respectively, of said parallel connected pairs of series connected transistors, one of said switches being connected to be enabled to a clock signal, CSI, and the remaining of said switches by an inverse clock signal, $\overline{CSI}$;
    first and second input transistors connected to provide a reference voltage and said TTL logic signal through its respective channel to a respective one of said common gate connections, said input transistors having a gate connection operable in response to said $\overline{CSI}$ signal;
    first and second inverter chains for providing complementary MOS logic levels in response to first and second complementary logic levels applied to an input of said inverter chains; and
    path means for connecting one of said inverter chain inputs to one of said transistor pair common gate connections, and the remaining inverter chain input to said remaining transistor pair common gate connections, in response to a first state of said CSI signal and $\overline{CSI}$ signal, and for isolating said inputs from said common gates in response to a second state of said CSI and $\overline{CSI}$ signals, whereby said inverters provide complementary outputs indicating the state of said latch during said first state of said signals.

3. A buffer circuit for providing complementary MOS logic levels in response to a TTL logic level comprising:
    a cross coupled MOS FET latch, said latching having first and second nodes, said latch assuming a logic state representing the difference of respective input potentials, at said nodes;
    means for coupling a reference voltage to one of said nodes and a TTL logic level to the remaining of said nodes in response to a first state of a clock signal, CSI, and an inverse clock signal, $\overline{CSI}$;

means for activating said latch in response to a second state of said CSI signal and $\overline{CSI}$ signal whereby said latch nodes assume a state dependent upon a previous voltage difference between said nodes;

first and second inverter chains for providing complementary MOS logic levels in response to first and second complementary input logic levels;

first and second path means connected to provide a connection between said first and second inverter chains and said first and second nodes, respectively, in response to said second state of said CSI and $\overline{CSI}$ signals, and for isolating said nodes from said inverter chains in response to said first state of said CSI signal and $\overline{CSI}$ signal, whereby said nodes assume a state determined by said TTL logic level and reference voltage, and said inverter chains are isolated from said latch, and during a subsequent state of said CSI and $\overline{CSI}$ signals, said latch is activated and said inverter chains are connected to nodes of said latch for providing complementary MOS levels, each said path means including first and second MOSFETS having channels connected in parallel, one of said MOSFETS being of an N type, and the second of said MOSFETS being a P type; one end of said parallel connected MOSFETS connected to a node, and the other end to an inverter chain;

a third MOSFET having a channel connected from said other end to a common voltage potential, said MOSFETS having gates connected to receive one of said CSI and $\overline{CSI}$ signals, whereby during one state of said signals said node is connected to said inverter chain and during a subsequent state of said signals, said inverter chain is isolated from said node and connected to said common voltage potential.

* * * * *

UNITED STATES PATENT AND TRADEMARK OFFICE
CERTIFICATE OF CORRECTION

PATENT NO. : 4,496,857
DATED : January 29, 1985
INVENTOR(S) : Hu H. Chao

It is certified that error appears in the above-identified patent and that said Letters Patent are hereby corrected as shown below:

In column 1, line 37, the Hitachi model should be --HM6147--.

In column 2, lines 50, 52 and 59, "$\overline{CSI}$" should be --CSI--.

In column 3, line 5, "from" should be --form--; on lines 11, 17 and 22, change "$\overline{CSI}$" to --CSI--.

In column 3, claim 1, line 60, "said" should be --and--.

Signed and Sealed this

Eighth Day of October 1985

[SEAL]

Attest:

DONALD J. QUIGG

Attesting Officer

Commissioner of Patents and
Trademarks—Designate